United States Patent [19]
Riechmann
[11] 3,743,865
[45] July 3, 1973

[54] PROXIMITY SWITCH

[76] Inventor: Wilhelm Riechmann, Ahornweg 31, 715 Backnang, Germany

[22] Filed: Dec. 29, 1971
[21] Appl. No.: 213,700

Related U.S. Application Data
[63] Continuation-in-part of Ser. No. 831,609, June 9, 1969, abandoned.

[52] U.S. Cl. .................. 307/308, 328/5, 340/258 C
[51] Int. Cl. ........................................ H03k 17/00
[58] Field of Search .......................... 328/5; 331/65; 340/258 C; 251/129; 4/166; 307/308

[56] References Cited
UNITED STATES PATENTS
3,483,437 12/1969 Coyne ............................ 340/258 C
3,551,919 1/1971 Forbes ........................ 251/129 UX
3,575,640 4/1971 Ishikawa ........................ 340/258 C

*Primary Examiner*—John W. Huckert
*Assistant Examiner*—B. P. Davis
*Attorney*—M. Robert Kestenbaum

[57] ABSTRACT

A capacitive proximity switch has a proximity electrode designed as an antenna. The signal from the electrode detunes an oscillator. Discrimination of the oscillated signal operates a bistable flip-flop to cause a thyristor in a load circuit to conduct and operate the coil of a magnetic valve.

12 Claims, 3 Drawing Figures

INVENTOR.
WILHELM RIECHMANN
BY M. R. Kestler

INVENTOR.

WILHELM NIECHMANN

BY Kestenbaum

INVENTOR.
WILHELM RIECHMANN
BY M. R. Kestel

PROXIMITY SWITCH

This is a continuation-in-part of my copending U.S. Pat. application No. 831,609, filed June 9, 1969 now abandoned.

The invention relates to a capacitive proximity switch and more particularly to one with a proximity eletrode which is connected with a component having a negative differential resistance at least temporarily.

A known proximity switch has a proximity electrode which is surrounded by a shield. The proximity electrode is connected via a capacitor with the control electrode of a cold-cathode tube. Upon the approach of a body which forms a capacitor relative to ground potential, for instance the approach of a person to a given distance from the proximity electrode, a small AC current flows to the control electrode of the cold-cathode tube, which is sufficient to fully ignite it.

This arrangement has the drawback that the body must have ground potential; specifically, it must have approximately the potential of the power supply. Sometimes this condition is not fulfilled. The proximity switch of known design is constructed so that the proximity electrode is built into a tile of synthetic material, which is fastened to the wall among other tiles. Electrostatic charges which result from cleaning these tiles can cause the closing, opening or reclosing of the proximity switch in a completely undefined manner, whereby water is wasted without purpose if the proximity switch is used, for instance, in a hospital for the contactless opening and closing of magnetic water valves. Also, if drops of water run down the tiles this proximity switch operates. Furthermore, the known switch cannot be opened any more by a second approaching body.

Accordingly, it is the object of this invention to provide a proximity switch which is free of such shortcomings.

According to the invention, this object is accomplished by designing the proximity electrode as an antenna. The condition requiring the absence of potential is thereby eliminated and one can operate the proximity switch regardless of whether the person performing the switching operation is at ground potential or not. This type of proximity switch is not to be confused with alarm systems in which a high-frequency AC field is generated in a room. Here, a person entering such a room disturbs the field configuration enormously. Furthermore, very high frequency circuits are required in such systems and very special and expensive antennas. Such installations would be unsuitable for the switching of magnetic valves, for instance, in hospitals and are also far too expensive.

Further advantages and features of the invention may be seen from the following description of a preferred example of execution taken together with the drawing, in which.

Figure 1:
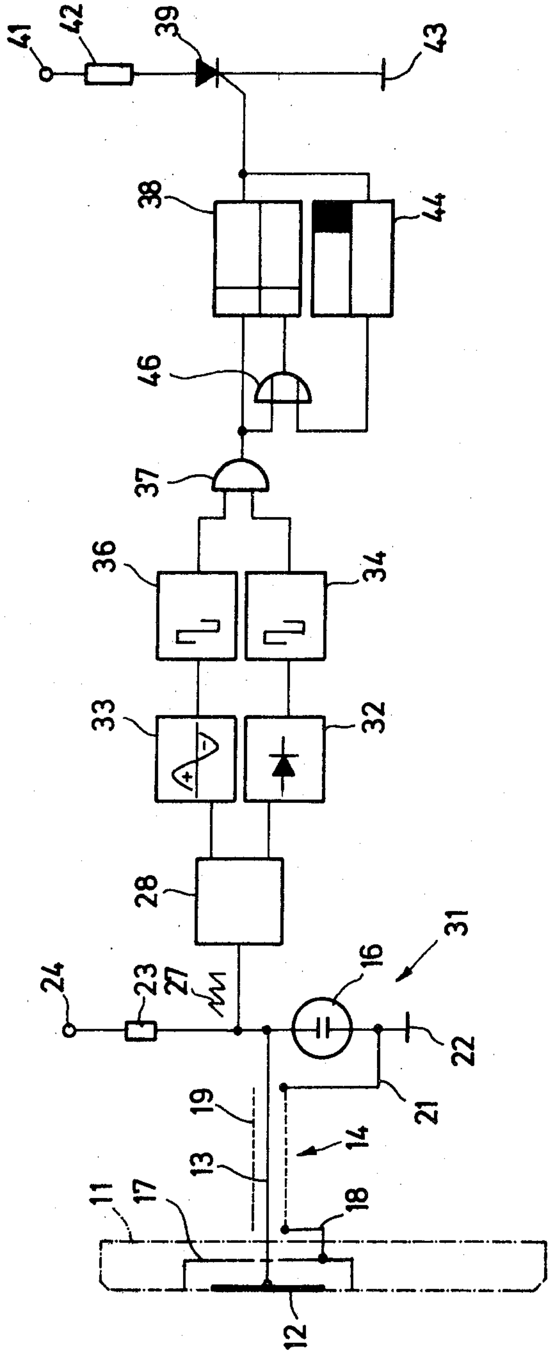
FIG. 1 shows a simplified block diagram of a first example of execution.

Referring now to FIG. 1, in a tile 11 of synthetic material is a proximity electrode 12 which is connected via the center conductor 13 of a coaxial cable 14 with one electrode of a glow lamp 16.

Behind the electrode 12 and in the tile 11 of synthetic material is a shield 17 through which the center conductor 13 is led. The shield 17 is connected to the braid 19 of the coaxial cable 14 via a wire 18. On the other side, the braid is connected, via a wire 21, with a reference point 22 and the other electrode of the glow lamp 16. The glow lamp 16 is connected with a power supply terminal 24 via a load resistance 23. The glow lamp 16 has a resistance differential resitance and together with the load resistance 23 and the capacity of the control cable 14 forms a relaxation oscillator which generates saw-tooth voltages 27. The glow lamp 16 is followed by an amplifier and impedance transformer 28, the input of which, because of the high impedance of the oscillator 31, is also of high impedance, and the output of which is of low impedance.

The amplifier and impedance transformer 28 is followed by an amplitude discriminator 33. The remainder of the circuit will be explained along with the description of the operation.

If, for instance, a hand is brought close to the proximity electrode 12, the oscillator 31 is detuned, which manifests itself in a change in the sawtooth voltages 27 as to amplitude as well as frequency. The change in amplitude is ascertained by the amplitude discriminator 32 and the amount of change compared with a reference value in a comparator 34. If the actual value deviates from the reference value, the comparator 34 generates an output signal.

Similarly, a comparator 36 generates an output signal if the output of the frequency discriminator 33 deviates from its predetermined value.

Only if a detuning takes place as to the frequency as well as of the amplitude, an AND circuit 37 delivers an output signal which puts a bistable flipflop in such a state that its output signal makes the thyristor 39 conductive. Thereby a current can flow from the terminal 41 via load resistance 42 to the reference point 43. In the example of execution, the load resistance 42 is the coil of a magnetic valve in a water line to a water faucet of a wash basin. Now water can flow from the faucet.

When the person has washed his hands, the hand is again brought near the proximity electrode 12 and again an output signal is generated at the output of the AND circuit 37, whereby a bistable flipflop 38 flips into its other state, the thristor 39 opens and current no longer flows through the load resistance 42. This means that the water no longer flows from the faucet.

If the person forgets to bring his hand near the proximity electrode after washing, a timing element 44 ensures that the bistable flipflop 38 is flipped back. The pulse which switches on the thyristor 39 was also fed to the timing element 44. The timing element 44 then delivers a pulse at its output after a certain period of time to an OR circuit 46. The output of OR circuit 46 resets the bistable flipflop 38.

In these and the following examples of execution, the shield 17 does not serve, as one might assume, to increase the sensitivity. It rather serves to prevent actuation from the right, i.e., from behind the synthetic tile 11. Otherwise water might be turned on if a person passes on the other side of the wall into which the ceramic tile is built.

Figure 2:
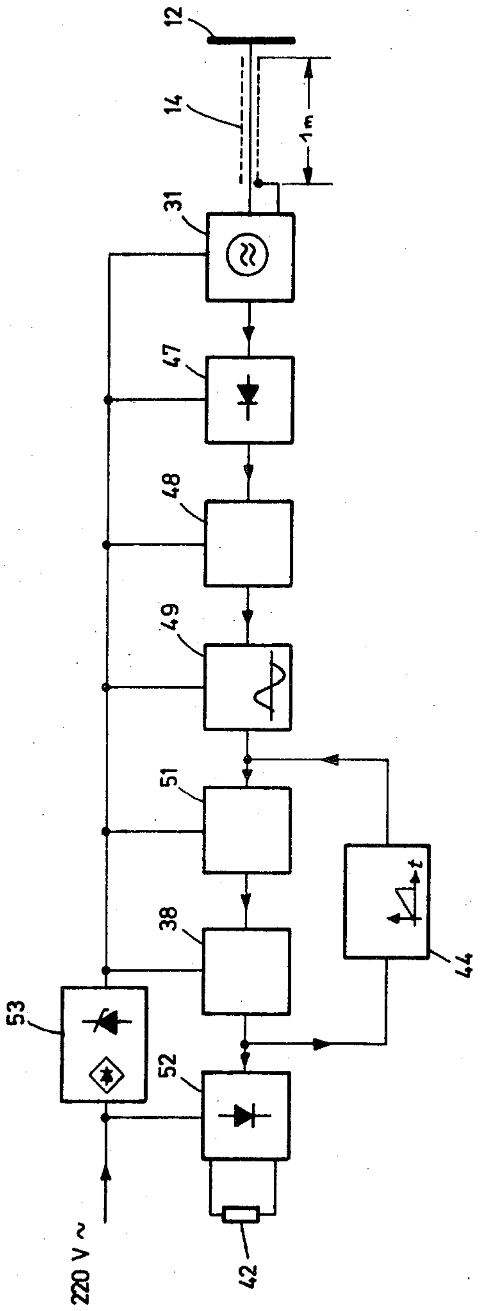
FIG. 2 shows a simplified block diagram of a second example of execution.

Referring to FIG. 2, in the second example of execution, the AND circuit 37, the discriminator 33 and the comparator 36 are dispensed with. It is possible to switch the thyristor 39 reliably on the basis of only one criterion, namely, the change in amplitude. Recognized will be the proximity electrode 12, the coaxial cable 14 and the oscillator 31, as well as a series sequence of a rectifier circuit 47, and impedance transformer circuit 48, an AC amplifier 49, a monostable flipflop 51, the bistable flipflop 38, a switching stage 52 and the load resistance 42. The components are supplied with current by means of a well stabilized power supply 53 via the lines shown. The timing element 44 is connected, in shunt with the monostable flipflop 51 and with the bistable flipflop 38.

Figure 3:
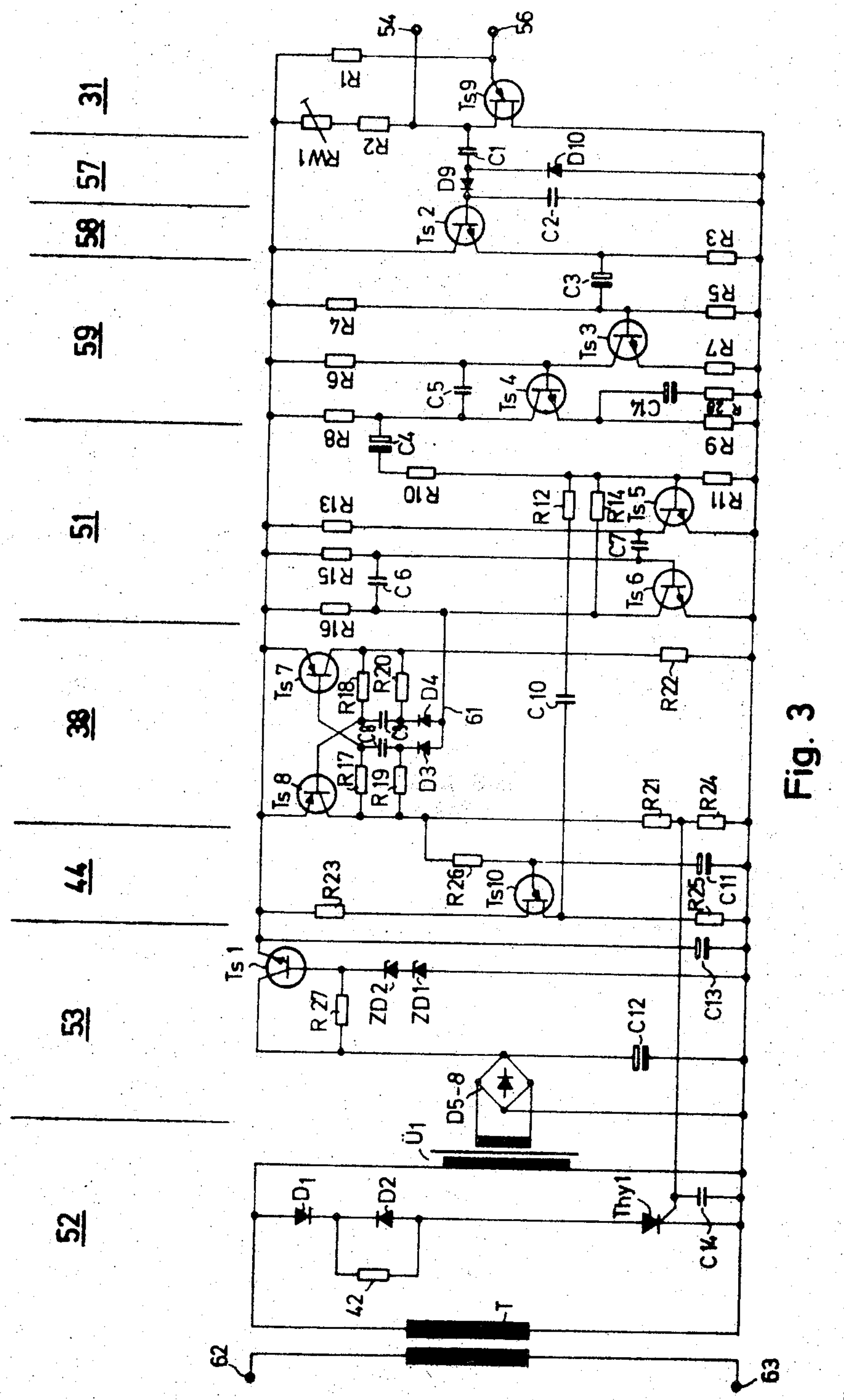
FIG. 3 shows a more detailed circuit diagram of the second example of execution.

The circuit, which has just been described for a better overview, is shown in greater detail in FIG. 3. The braid 19 is connected to a terminal 54, while the center conductor 13 is connected to a terminal 56. The emitter of a unijunction transistor Ts9 is supplied with bias via a resistor R1. The bias of base 2 of the unijunction transistor Ts9 can be adjusted by means of a variable resistor RW 1. A resistor R2 serves as a protective resistance in the event that resistor RW 1 accidentally becomes zero.

The base 2 is connected with a voltage-doubling peak rectifier 57, which comprises the capacitors C1 and C2 as well as the diodes D9 and D10.

This peak rectifier 57 is followed by an impedance transformer 58 which consists of a transistor Ts2 and an emitter resistor R3. This collector stage is connected via a capacitor C3 to a two-stage AC amplifier 59. In the example of implementation, the capacitor C3 is 15 $\mu$F, as is the capacitor C4. Thus the capacitors C3 and C4 have a very low AC impedance. Resistors R4 and R5 serve as base voltage dividers for a transistor Ts3. A resistor R7 serves as negative feedback resistance, while a resistor R6 is the load resistance for the transistor Ts3. As may be seen from the circuit diagram, the output of the transistor Ts3 is DC coupled to the input of a transistor Ts4. Resistors R9 and R28 as well as a capacitor C14 constitute a combined AC and DC negative feedback, while a resistor R8 serves as the load resistance for the transistor Ts4. A capacitor C5 serves as negative feedback for the transistor Ts4 and suppresses interference spikes which can be caused, for instance, by switching on and off electrical appliances. The capacitor C5 is more effective in the second stage than it would be if it were used in the first stage. The monostable flipflop 51 is connected to the AC amplifier 59 via the capacitor C4 and the resistor R10. Its time constant is determined essentially by a capacitor C6 and a resistor R15. The monostable flipflop 51 comprises transistors Ts5, Ts6, a coupling capacitor C7, a load resistor R13 for the transistor Ts5, a base voltage feed resistor R15, a negative feedback capacitor C6 and a load resistor R16. The monostable flipflop 51 flips if the input signal at the base of the transistor Ts5 exceeds a certain value. Thereupon the monostable flipflop 51 delivers a pulse of defined duration at the collector of the transistor Ts6. A resistor R14 serves as negative feedback over both stages.

The following bistable flipflop 38 comprises two transistors Ts7 and Ts8, resistors R17, R18, R19 and R20, capacitors C8, C9 and diodes D3 and D4. As may be seen from the structure of the bistable flipflop 38, which is known per se, It is provided with storage circuits in the form of capacitors C8, C9 and the resistors R19 and R20, so that only a single line 61 is required for control in the ON state as well as in the OFF state. Every second pulse on the line 61 therefore has the same effect on the bistable flipflop 38. Resistor R22 serves as load resistance of the transistor Ts7 and the resistors R21 and R24 serve as load resistance for the transistor Ts8. From their center tap, a thyristor Thy 1 is fed as its control electrode. The circuit described has the advantage that Thy 1 receives current continuously from the bistable flipflop 38 if the latter is in the ON state. It is then not necessary that the thyristor Thy 1 be ignited continuously after each half wave, as is usual otherwise. Together with a protective capacitor C14 and two diodes D1 and D2, the thyristor Thy 1 belongs to the switching stage 52. The diode D1 ensures that the current in the secondary circuit of the coil of transformer T always flows in the same direction, while the diode D2 in shunt with the load resistor 42 serves the purpose of preventing chattering, as in latching circuits, in such cases where the load resistance 42 is represented by exciter coils.

To supply power, the transformer T is connected to terminals 62 and 63. As is seen here, there is complete DC separation between the two coils of this transformer. In parallel with the secondary coil of the transformer is a transformer ü1, the secondary coil of which feeds a rectifier bridge circuit which includes diodes D5 to D8. A smoothing capacitor C12 serves for smoothing the voltage and a transistor Ts1 together with Zener diodes ZD1 and ZD2 takes care of stabilizing the DC voltage. A resistor R27 feeds the base current. A further smoothing capacitor C13 smooths the voltage prevailing at the output of the power supply 53 again. A very stable power supply is required here so that voltage variations originating in the power supply are not erroneously interpreted by the proximity switch as signals which should indicate the approach of an object toward the proximity electrode 12.

From the output of the bistable flipflop 38 is fed via a resistor R26 the timing element 44 which comprises a unijunction transistor Ts10 with its bias resistors R23 and R25. A capacitor C11, together with the resistor R26 produces a time constant, after which the unijunction transistor Ts10 delivers, at the base 1, a signal to the input of the monostable flipflop 51 via a capacitor C10 and a resistor R12.

The circuit described above can operate with floating potential; that is, free of a reference potential. The secondary of transformer T is not grounded and therefore the whole circuit on the right side is nowhere on a fixed potential. As shown in FIG. 1, the reference points 22 and 43 are not at ground but only at a common potential. Therefore, unlike known devices in the art which employ an antenna having a reference potential, (e.g., ground) $\pm$ the oscillation amplitude of the device, the antenna of the present invention radiates oscillations about a floating potential.

Although the whole circuit on the right side of transformer T in FIG. 3 is shown nowhere on a fixed potential, the separation point could be shifted more to the right. It has been found that to avoid the possibility of unexpected operation of the device by noise voltages, the oscillator circuit, the amplitude discriminator as shown in FIG. 2 together with the frequency discriminator, if included, as shown in FIG. 1, and the comparator(s) should be on a floating potential in addition to the antenna 12. Additionally the separation should be made by a transformer rather than a capacitor to give low ohmic values to the circuit. Thus such included voltages will be much lower than in an ohmicly high circuit.

The use of a capacitor for separation purposes would produce a circuit of high ohmic values in which noise voltages might operate the discriminator and comparator. Referring to FIG. 3, the transformer separation could take place betweeen the monostable flip-flop 51 and the bistable flip-flop 38 so that the monostable flip-flop 51, the AC amplifier 59, the impedance transformer 58, the rectifier 57 and the oscillator 31 would be free of a reference potential in addition to the antenna 12.

If an object, for instance, a pail of water, is placed in the vicinity of the proximity switch 12, the proximity switch will operate once, because a change in amplitude takes place in the generator 31. This amplitude change is transmitted to the AC amplifier 59 via the capacitor C3 and the proximity switch operates once. If the pail now remains there, the capacitor C3 acts as a block. If now additionally a hand is brought close to the proximity electrode 12, a further detuning, i.e., a further change of the voltage amplitude, takes place, which is now transmitted by the capacitor C3. This means that a constant detuning of the oscillator 31 cannot detrimentally influence the mode of operation of the proximity switch.

In the monostable flip-flop 51, the resistor R10 decouples the feedback R14 of the transistors Ts6 and Ts5 as well as the feeding of the timing element 44 via R12. It has been found that the circuit can work entirely without a shield, as due to the manner of amplification and negative feedback it is highly insensitive with regard to interference voltage spikes.

In principle, the feedback starting from the unijunction transistor Ts10 via the capacitor C10 and the resistor R12 could be placed at the input of the bistable flip-flop 38 instead of the input of the monostable flip-flop 51. This, however, would require either an inverter stage in order to obtain the correct phase relation, or the transistors Ts7 and Ts8 would have to be NPN transistors.

In the proximity switch described, static charges on the synthetic tile surrounding the proximity electrode have no effect at all, and upon wetting with liquid, the proximity switch operates once but is immediately fully ready for operation again in the wet condition, so that a second approach to the wet tile will switch it off.

What is claimed is:

1. A proximity switch for controlling water taps in sanitary appliances by bringing a part of a human body in the vicinity thereof comprising a proximity electrode comprising an antenna operating on a floating potential an oscillator circuit which includes said proximity electrode and is detuned to generate changed oscillations when said body part is approaching said antenna and an amplitude discriminator following said circuit.

2. A proximity switch for controlling water taps in sanitary appliances by bringing a part of a human body in the vicinity thereof comprising a proximity electrode comprising an antenna which is free of a reference potential, an oscillator circuit which includes said proximity electrode and is detuned to generate changed oscillations when said body part is approaching said antenna, at least a portion of said oscillator circuit in addition to said proximity electrode being free of a reference potential and an amplitude discriminator following said circuit.

3. A proximity switch according to claim 2 in which said oscillator circuit and said amplitude discriminator are free of a reference potential.

4. A proximity switch according to claim 3 in which the amplitude discriminator is followed by a comparator which is free of a reference potential.

5. A proximity switch according to claim 2 in which the portion of the switch which is free of a reference potential is separated from the reference potential by transformer means.

6. A proximity switch for controlling water taps in sanitary appliances by bringing a part of a human body in the vicinity thereof comprising a proximity electrode comprising an antenna which is free of a reference potential, an oscillator circuit which includes said proximity electrode and is detuned to generate changed oscillations when said body part is approaching said antenna, and an amplitude discriminator following said circuit and a threshold stage following said amplitude discriminator.

7. A proximity switch according to claim 6 in which the amplitude discriminator and the threshold stage are a monostable flip-flop.

8. A proximity switch according to claim 7 in which the amplitude discriminator is preceded by a DC coupled AC amplifier.

9. A proximity switch according to claim 6 in which the threshold stage is followed by a bistable flip-flop the output of which is connected to a current switch.

10. A proximity switch according to claim 9 in which the output of the bistable flip-flop is connected to time delay means and the output of the time delay means is connected to a point in advance of the bistable flip-flop.

11. A capacitive proximity switch for controlling water taps in sanitary appliances by bringing a part of a human body in the vicinity thereof comprising a proximity electrode comprising an antenna which is free of a reference potential, an oscillator circuit which includes said proximity electrode and is detuned to generate change oscillations when said body part is approaching said antenna, at least a portion of said oscillator circuit in addition to said proximity electrode being free of a reference potential, and a frequency discriminator following said circuit.

12. A proximity switch for controlling water taps in sanitary appliances by bringing a part of a human body in the vicinity thereof comprising a proximity electrode comprising an antenna, an oscillator circuit which includes said proximity electrode and is detuned to generate changed oscillations when said body part is approaching said antenna, an amplitude discriminator following said circuit, a comparator following said amplitude discriminator, resettable means following said comparator which operates a current switch upon receipt of a signal from said comparator and timing means having its input connected to the output of said current switch operating means and its output connected in advance of said current switch operating means to reset said current switch operating means after a predetermined period of time.

* * * * *